United States Patent
Chi

(10) Patent No.: US 8,638,075 B2
(45) Date of Patent: *Jan. 28, 2014

(54) APPARATUS AND METHOD FOR RECOVERY OF WASTED POWER FROM DIFFERENTIAL DRIVERS

(75) Inventor: Hongwu Chi, Sunnyvale, CA (US)

(73) Assignee: Analogix Semiconductor, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/237,779

(22) Filed: Sep. 20, 2011

(65) Prior Publication Data

US 2012/0007664 A1    Jan. 12, 2012

Related U.S. Application Data

(63) Continuation of application No. 11/820,745, filed on Jun. 19, 2007, now Pat. No. 8,035,359, which is a continuation-in-part of application No. 11/800,861, filed on May 7, 2007.

(51) Int. Cl.
*H05F 1/00*    (2006.01)

(52) U.S. Cl.
USPC .............................. 323/268; 323/222; 455/91

(58) Field of Classification Search
USPC .......... 323/220, 222, 224, 234, 268; 327/540, 327/541; 455/91–129
See application file for complete search history.

(56) References Cited

U.S. PATENT DOCUMENTS

| | | | |
|---|---|---|---|
| 3,959,772 A | 5/1976 | Wakasa et al. | |
| 4,476,535 A | 10/1984 | Loshing et al. | |
| 4,964,140 A | 10/1990 | Yonekura | |
| 5,281,873 A | 1/1994 | Seki | |
| 5,842,140 A | 11/1998 | Dent et al. | |
| 5,898,297 A | 4/1999 | Bosnyak et al. | |
| 5,907,264 A * | 5/1999 | Feldman | 332/103 |
| 5,932,123 A | 8/1999 | Marhofer et al. | |

(Continued)

FOREIGN PATENT DOCUMENTS

| | | |
|---|---|---|
| EP | 1318601 | 6/2003 |
| WO | 00/45558 | 8/2000 |

OTHER PUBLICATIONS

Freed, Adrian, "Bi-directional AES/EBU Digital Audio and Remote Power Over a Single Cable", CNMAT, UC Berkeley, Berkeley, California, (undated), pp. 1-6.

(Continued)

*Primary Examiner* — Adolf Berhane
*Assistant Examiner* — Yemane Mehari
(74) *Attorney, Agent, or Firm* — Carr & Ferrell LLP

(57) ABSTRACT

An apparatus and method for supplying power to circuits of an integrated circuit (IC) from the wasted power in low-swing high-speed differential line drivers used in the IC, is disclosed. In a high speed line driver the load resistors of the driver are connected to a power supply, either the local power supply or the receiver power supply. DC power for the driver is supplied through these resistors. A large portion of this power, supplied from the power supply is wasted in the DC set-up circuit of the differential line driver. It is proposed to use this wasted power to power selected circuits of an IC. The use of this wasted power from the drivers for powering the circuits reduces the overall power dissipation of the system.

10 Claims, 3 Drawing Sheets

(56) References Cited

U.S. PATENT DOCUMENTS

| | | |
|---|---|---|
| 6,292,901 B1 | 9/2001 | Lys et al. |
| 6,720,745 B2 | 4/2004 | Lys et al. |
| 6,731,132 B2 | 5/2004 | Aloisi |
| 6,775,160 B2 * | 8/2004 | Siri ................................. 363/89 |
| 7,127,623 B2 | 10/2006 | Potega |
| 7,138,992 B2 | 11/2006 | Nakamura |
| 7,141,958 B2 | 11/2006 | Saitoh |
| 7,142,480 B2 | 11/2006 | Chamberlain |
| 7,145,541 B2 | 12/2006 | Kurokawa et al. |
| 7,149,644 B2 | 12/2006 | Kobayashi et al. |
| 7,154,761 B1 | 12/2006 | Camerlo et al. |
| 7,154,981 B2 | 12/2006 | Tokuhiro et al. |
| 7,158,003 B2 | 1/2007 | Cern et al. |
| 7,158,563 B2 | 1/2007 | Ginis et al. |
| 7,269,673 B2 | 9/2007 | Kim et al. |
| 7,446,567 B2 | 11/2008 | Otsuka et al. |
| 7,511,515 B2 | 3/2009 | Herbold |
| 7,583,033 B2 | 9/2009 | Ikeda |
| 7,712,976 B2 | 5/2010 | Aronson et al. |
| 8,035,359 B2 * | 10/2011 | Chi ................................. 323/268 |
| 2003/0210074 A1 | 11/2003 | Morgan et al. |
| 2005/0007162 A1 | 1/2005 | Torres |
| 2006/0005055 A1 | 1/2006 | Potega |
| 2006/0145954 A1 | 7/2006 | Kubota et al. |
| 2006/0284649 A1 | 12/2006 | Cho et al. |
| 2006/0287763 A1 | 12/2006 | Ochi et al. |
| 2006/0291493 A1 | 12/2006 | Schley-May et al. |
| 2006/0291575 A1 | 12/2006 | Berkman et al. |
| 2007/0291938 A1 | 12/2007 | Rao et al. |
| 2008/0278122 A1 * | 11/2008 | Chi ................................. 323/220 |
| 2008/0278224 A1 | 11/2008 | Chi |
| 2009/0189442 A1 | 7/2009 | Chi |

OTHER PUBLICATIONS

Engdahl, Tomi, "Get power out of PC RS-232 port", Electronics Circuits Designed by Tomi Engdahl, (1997), pp. 1-6.

Elliott, Rod, "Balanced Line Driver & Receiver", Elliott Sound Products, Project 51, (1999), pp. 1-5.

International Search Report and Written Opinion of the International Searching Authority Dated Jun. 27, 2008, International Application No. PCT/US2007/023974.

International Search Report and Written Opinion of the International Searching Authority Dated Jun. 27, 2008, International Application No. PCT/US2007/024015.

International Search Report and Written Opinion of the International Searching Authority Dated Dec. 18, 2008, International Application No. PCT/US2008/011525.

* cited by examiner

APPARATUS AND METHOD FOR RECOVERY OF WASTED POWER FROM DIFFERENTIAL DRIVERS

CROSS-REFERENCE TO RELATED APPLICATION

This application is a continuation of U.S. patent application Ser. No. 11/820,745, filed Jun. 19, 2007, now U.S. Pat. No. 8,035,359 which in turn is a continuation-in-part of U.S. patent application Ser. No. 11/800,861, filed May 7, 2007. The disclosures of the aforementioned applications are incorporated herein by reference in their entirety.

BACKGROUND OF THE INVENTION

1. Field of the Invention

The invention generally relates to the powering of circuit blocks and devices in a system implemented as an integrated circuit, system on a chip or a chip on board using the wasted power from low swing, high speed differential driver supply.

2. Prior Art

A typical data processing and transmitting system 100 is shown in FIG. 1. The system shows a typical system on chip (SOC) implementation of data processing circuits with differential drivers, their peripheral circuits 110, and a set of associated circuit blocks 105. The associated circuits 105 include integrated circuits like memory, digital-to-analog converter (DAC), analog-to-digital converter (ADC), clock circuits, and other circuits that make up the SOC 100. It also shows termination load resistors 120 that are either part of the SOC 100 or part of the remote receiver. The driver, including twin differential drivers NL0 and NL1 115, of the source transmitter, driving the signal lines TXN and TXP respectively, are connected through the resistors R0 and R1 120 to power supply (Removed receiver side). The resistors are connected typically in circuit shown in the example, to the 3.3v nominal power supply. The transmitter drivers draw current from the receiver power supply, through the resistors that enable the signal swing as per the system specification. Since the drivers are differential they draw a constant DC current and consume power. Part of the power that is consumed is in the switching of the differential drivers, and the rest is used for setting up the DC conditions of the drivers with a fixed voltage and/or current. This part of the power is wasted power.

In the prior art FIG. 1 the power supply to the circuits like pre-amplifier 111, phase locked-loop (PLL) 112, data processing circuits 113, bias circuits 114, and associated circuits 105 are provided from the power connection to the SOC 100 from an external supply.

A typical driver 115 of a high speed transmission channel draws about 10.0 to 24.0 mA nominal DC current from the power supply. Typically the signal swing across the load resistors 120 is 0.4 to 0.6 V which leaves 2.7 V out of the typical 3.3V supply. This power is currently dissipated in setting up the DC conditions of the drivers and hence wasted. This power is available and can be tapped to power part of the peripheral circuits 111, 112 and 114 of the driver, data processing circuits 113 and some of the associated circuits 105 in the SOC 100 as disclosed in this disclosure.

It would be therefore advantageous to provide a circuit that reduces the amount of wasted power. It would be further advantageous if such a circuit can reduce the power consumption of the system and enable a low power implementation.

BRIEF DESCRIPTION OF THE DRAWINGS

In order to better understand the principles of the disclosed invention the following drawings are provided. It should be noted that driver power supply, typically being 3.3V, is designated in the drawings as VDD. The power supply to the peripheral circuits, data processing section and associated circuits is designated Vdd in the drawings.

DETAILED DESCRIPTION OF THE PREFERRED EMBODIMENTS

Figure 1:
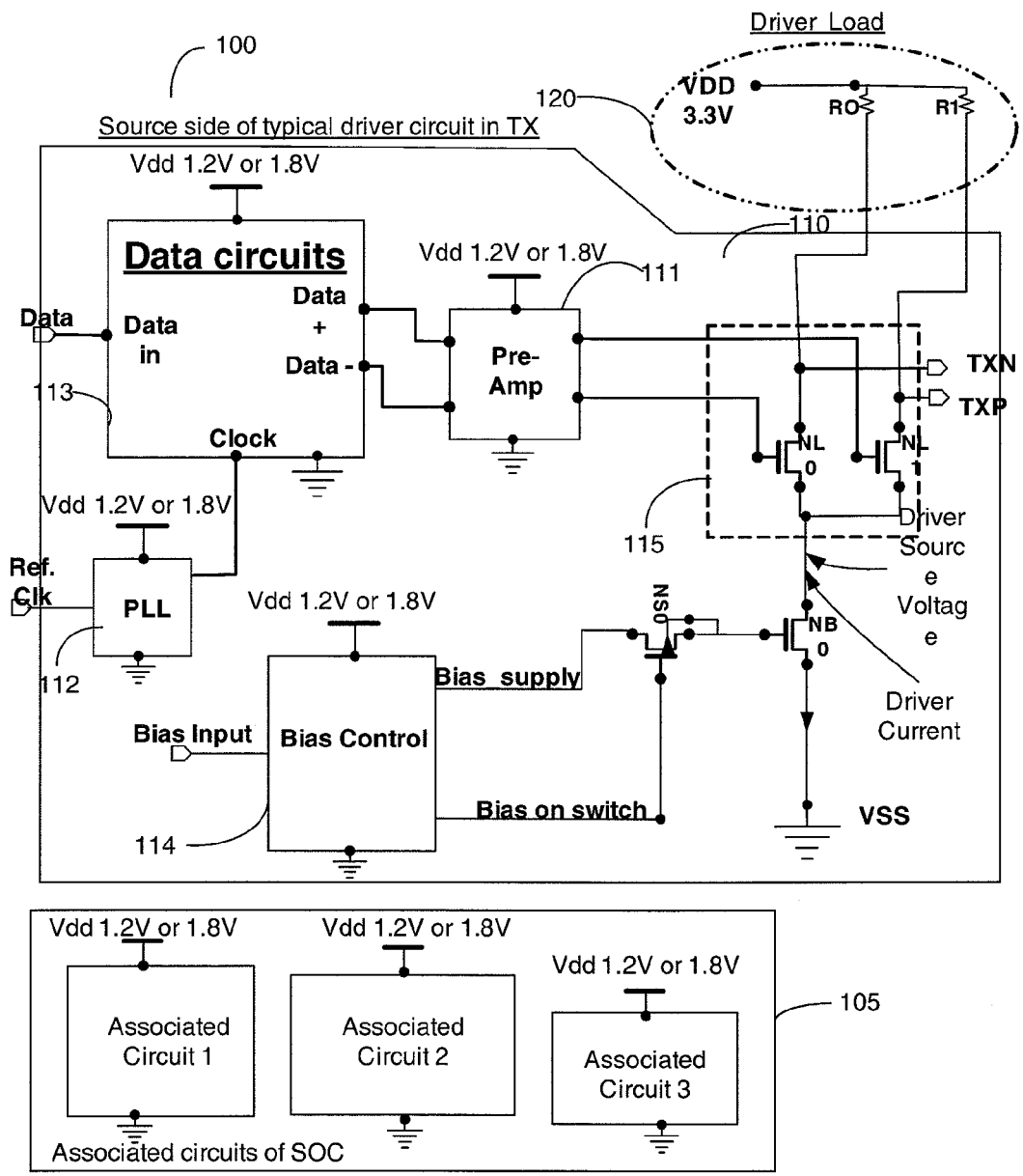
FIG. 1 is a block diagram of prior art SOC with external power supply connected to all circuits.

An apparatus and method for supplying power to integrated circuits (ICs) of a system implemented as a system on a chip, (SOC) from the wasted power in low-swing high-speed differential line drivers used in the system, is disclosed. In a high speed line driver the load resistors of the driver are connected to a power supply, either the local power supply or the remote receiver power supply. DC power for the driver is supplied through these resistors. A large portion of this power, supplied from the power supply is wasted in the DC set-up circuit of the differential line driver. It is proposed to use this wasted power to power selected circuits of the ICs in the system. The use of this wasted power from the drivers for powering the circuits reduces the overall power dissipation of the system. The disclosed apparatus and method are applicable for integrated circuit (IC), a system on chip (SOC), chip on board (COB) implementations and other system and circuit level implementations.

The following description refers to a SOC however this should not be viewed as limiting the scope of the invention in general, and in particular to the use with ICs and COBs. In a typical differential driver circuit, the load resistors of the output driver are connected to the DC power for the driver either on the SOC or, at the remote load in a receiver. The typical power supply for such a high speed driver is typically a 3.3V supply. The typical high speed driver has a limited swing of 0.4 to 0.6 V and typically 10 mA current only. In prior art implementations of circuits the rest of the voltage at the supply current that is supplied by, for example, the 3.3 V supply, is wasted in setting the DC conditions of the differential line driver. It is proposed to use this wasted power from the differential drivers to power selected peripheral circuits, such as circuits 111, 112, and 114 of the driver 115, the data processing circuits 113, and any other associated circuits 105 of the SOC, that are within the current supply capabilities. The use of this wasted power of the driver for powering the peripheral circuits reduces the total system power and enables low power circuit implementation.

Figure 2:
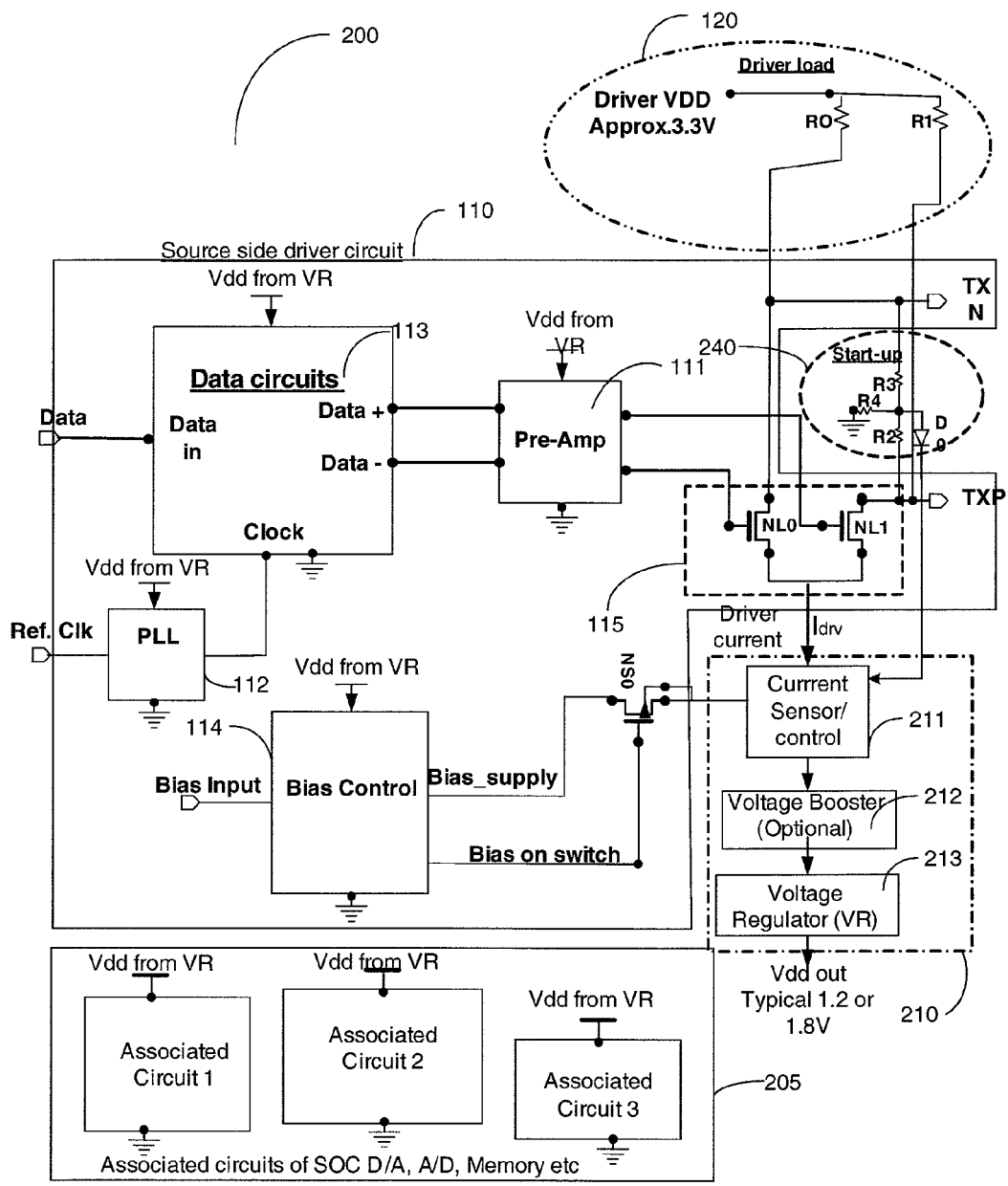
FIG. 2 is a block diagram showing an SOC with power to peripherals, data processing circuits and some associated circuits supplied in accordance with the principles of the disclosed invention from the recovered power of the drivers.

FIG. 2 is a non-limiting and exemplary SOC system 200 implemented in accordance with the principles of the disclosed invention. The output drivers have load resistors 120 including resistors R0 and R1 connected to the driver power supply. For the typical differential driver pair, the specified current drive is in the range of 10 mA to 24 mA per drive pair. In the case of a DC coupled Transition Minimized Differential Signaling (TMDS) link implementations, like those of HDMI or DVI transmitters, the output drive of the differential pair is 10 mA for each of four channels, or a total of 40 mA from the nominal value of the power supply, typically at 3.3V. The output swing specification for a typical high speed driver is 0.4 to 0.6V. Hence for a 0.6V swing specification, the current source of the driver has to dissipate power of 40 mA×(Vdd−0.6V). That means a minimum 1.8 Volt supply capable of driving close to 40 mA is available at the interconnected source of the differential driver transistors, NS0 and NS1. This available power can be recovered and regulated using a voltage regulator and used as a power supply for circuits of the SOC as per current availability. Accordingly the disclosed invention, by using the recovered power supplied through the load resistors, reduces the power dissipation of the total system. This recovered power supply is regulated by means of circuit 210, designed in accordance with the principles of the disclosed invention, to enable the utilization of the wasted power, or otherwise reduce the power requirements of the SOC 200. The output of circuit 210 is used to supply power to at least some of the standard peripheral circuits 111, 112, and 114, the data processing section 113, and the associated circuits 105.

In an exemplary and non-limiting case where the required supply is greater than 1.8V, it is still possible to use the wasted power with suitable voltage enhancing circuitry like a voltage booster 212. This is an optional element and can be eliminated when it is not required. The available current as input to this supply is the DC current of the differential drivers and the available voltage is that at the interconnected source of the driver transistors NS0 and NS1 of the differential drivers.

Circuit 210, with the voltage regulator 213, regulates the voltage of the recovered power supply. Since the current through the recovered circuit is the necessary current through the differential driver circuits a current sensor and biasing control citcuit 211 is used to sink the required total 40 mA through this recovered power supply.

Figure 3:
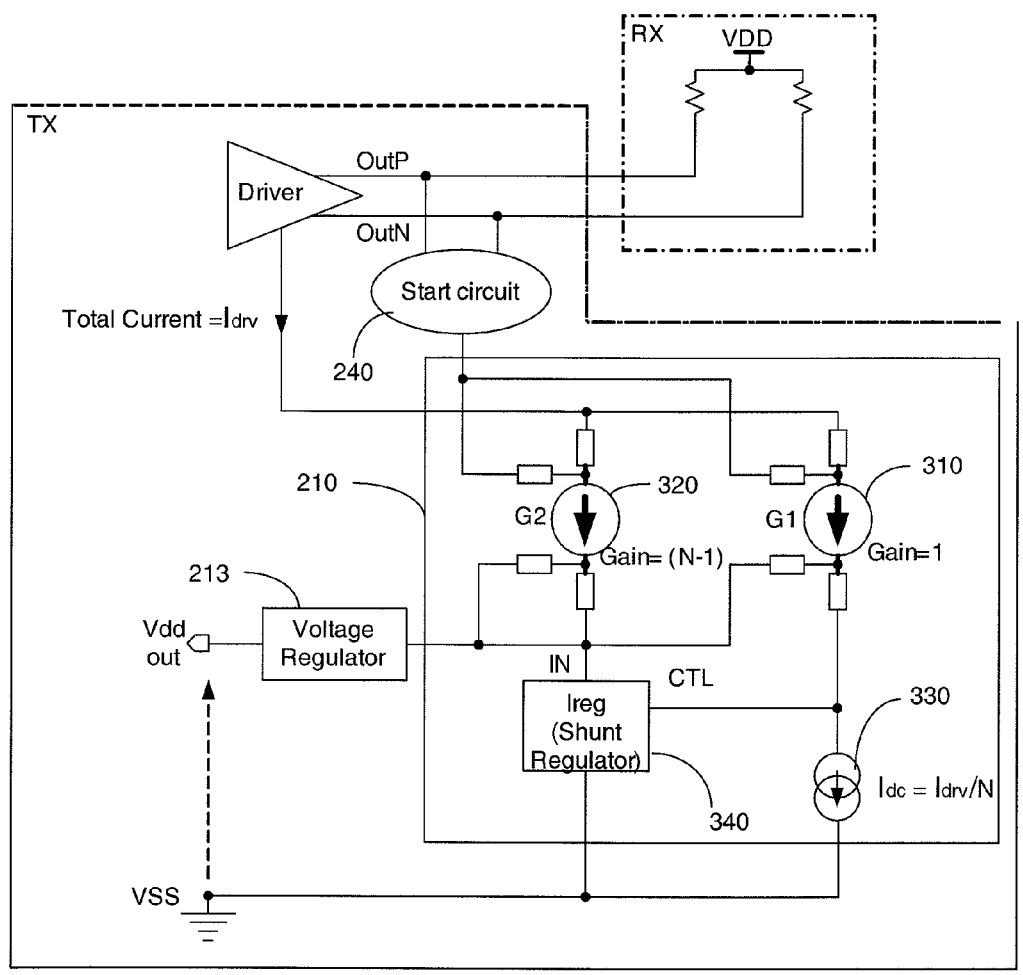
FIG. 3 is a schematic diagram showing exemplary implementation of the disclosed invention.

Reference is now made to FIG. 3 that shows an exemplary implementation of the current invention. The driver current of the differential driver transistor pair, including NS1 and NS2, is at a pre defined value, for example 10 mA per pair, to adhere with the system requirements. In order to achieve this, a biasing control circuit 211 with current sensing elements and current control is used, functioning as described herein below. Current sensing elements G1 310 and G2 320 are voltage controlled current sources with a $g_m$ proportional to 1 and N−1 providing a $g_m$ ratio of 1:N−1. Examples of G1 and G2 are MOSFET or BJT devices. It is possible to use more than two voltage controlled current sources, but at least two are necessary. The startup circuit 240 causes the circuit to start operating when the power is supplied to the load resistors as the rest of the SOC circuits derive power from the recovered supply. This means that until the bias for the system is established the driver devices may remain in the off state. This startup circuit 240 taps or bleeds a small amount of power from the load resistors 120 as soon as connection is made to the remote termination, to generate a $V_{bias}$ voltage for G1 310 and initiate the operation of the biasing control circuit 211. The voltage controlled current source G1 310 acts as a reference current sensor and control, with a fixed current source 330 of $I_{drv}/N$ coupled to it. The voltage developed across the current source 330 is fed to the control pin, CTL of the shunt regulator 340. The shunt regulator forces the voltage at its input pin, IN, to equal that the voltage at its CTL pin by shunting the current through it. In doing so, the current passing through the shunt voltage controlled current source G2 320, will be equal to N−1 times the reference current in G1 310, which will be $(N-1)*I_{drv}/N$. Once the bias is operational, the startup circuit 240 is effectively removed from the operation. This makes the total current passing through the driver to be fixed at $I_{drv}$, from both the voltage controlled current sources together, enabling the full driver current. The current through G2 320, with the voltage at the source of the device G2 320, is then available as output of the biasing control circuit 211, for use as supply voltage. After regulation by the voltage regulator 213, this recovered power, voltage and current, can be used to power the chosen circuit elements of the SOC.

This voltage can also be boosted, if necessary, by the voltage booster 212, prior to regulation in the voltage regulator 213. This recovered and regulated supply voltage can then be used also by any of the circuits of the SOC that requires higher than the voltage available at the source of the shunt voltage controlled current source G2 320. Similarly lower regulated voltage can be generated using known in the art techniques.

A person skilled-in-the-art would readily appreciate that the invention disclosed herein is described with respect to specific embodiments. However, this should not be considered a limitation on the scope of the invention. Specifically, other implementations of the disclosed invention are envisioned and hence the invention should not be considered to be limited, to the specific embodiments discussed herein above. Rather, the scope of the disclosed invention is as broad as its claims and the power recovered from the differential drivers as suggested herein may be used in powering any type of IC, SOC or COB circuits.

What is claimed is:

1. A method for powering a part of an electronic circuit from at least a portion of wasted power recovered from a differential driver pair, the method comprising:
   biasing sources of the differential driver pair using a biasing control circuit;
   recovering the at least a portion of wasted power from the biasing control circuit;
   regulating the recovered power; and,
   supplying the regulated power as voltage and current output to power at least part of the electronic circuit.

2. The method of claim 1, wherein the electronic circuit is a portion of one of: an integrated circuit (IC), a system on chip (SOC), a chip on board (COB).

3. The method of claim 2, wherein using the recovered power reduces the power consumption of said one of: IC, SOC, COB.

4. The method of claim 1, wherein the recovering comprises:
   recovering the power supplied through resistor loads connected to a supply voltage.

5. The method of claim 1, wherein said regulating of the recovered power further comprises:
   boosting the voltage to a usable voltage by means of a voltage booster.

6. The method of claim 1, wherein using the recovered power reduces the total power dissipation of the system.

7. A power recovery and supply method for recovering and using wasted power from a DC coupled output driver pair of a TMDS comprising:
   biasing sources of the DC coupled output driver pair using a biasing control circuit;
   recovering the wasted power of the DC coupled output driver pair using a power recovery circuit;
   regulating the recovered power using a voltage regulator; and
   supplying the regulated power as voltage and current outputs to power at least a portion of the circuits of the system.

8. The method of claim 7, wherein the method is implemented in one of:
   an integrated circuit (IC), a system on chip (SOC), a chip on board (COB).

9. The method of claim 7, wherein the DC coupled output drivers are part of a TMDS that is a HDMI transmitter system.

10. The method of claim 7, wherein the DC coupled output drivers are part of a TMDS that is a DVI transmitter system.

* * * * *